(12) United States Patent
Kim et al.

(10) Patent No.: US 8,279,667 B2
(45) Date of Patent: Oct. 2, 2012

(54) INTEGRATED CIRCUIT MEMORY SYSTEMS AND PROGRAM METHODS THEREOF INCLUDING A MAGNETIC TRACK MEMORY ARRAY USING MAGNETIC DOMAIN WALL MOVEMENT

(75) Inventors: Ho Jung Kim, Suwon-si (KR); Sang Beom Kang, Hwaseong-si (KR); Chul Woo Park, Yongin-si (KR); Hyun Ho Choi, Suwon-si (KR); Jong Wan Kim, Seongnam-si (KR); Young Pill Kim, Hwaseong-si (KR); Sung Chul Lee, Youngin-si (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 12/775,133

(22) Filed: May 6, 2010

(65) Prior Publication Data
US 2010/0284209 A1 Nov. 11, 2010

(30) Foreign Application Priority Data

May 8, 2009 (KR) .................. 10-2009-0040291
May 8, 2009 (KR) .................. 10-2009-0040293

(51) Int. Cl.
G11C 11/15 (2006.01)
(52) U.S. Cl. .................. 365/173; 365/171; 365/230.03; 365/230.07; 365/189.05; 365/66; 365/51
(58) Field of Classification Search .................. 365/173, 365/171, 66, 51, 230.03, 230.06, 230.07, 365/189.05
See application file for complete search history.

(56) References Cited

U.S. PATENT DOCUMENTS

| | | | |
|---|---|---|---|
| 6,781,871 B2 | 8/2004 | Park et al. |
| 6,834,005 B1 | 12/2004 | Parkin |
| 6,898,132 B2 | 5/2005 | Parkin |
| 6,920,062 B2 | 7/2005 | Parkin |
| 6,955,926 B2 | 10/2005 | Chen et al. |
| 6,970,379 B2 | 11/2005 | Parkin |
| 7,031,178 B2 | 4/2006 | Parkin |
| 7,108,797 B2 | 9/2006 | Chen et al. |
| 7,236,386 B2 | 6/2007 | Parkin |
| 7,242,604 B2 | 7/2007 | Klaeui et al. |
| 7,315,470 B2 | 1/2008 | Parkin |

(Continued)

FOREIGN PATENT DOCUMENTS

JP 2007-234208 9/2007

(Continued)

*Primary Examiner* — Andrew Q Tran
(74) *Attorney, Agent, or Firm* — Myers Bigel Sibley & Sajovec, P.A.

(57) ABSTRACT

Provided are nonvolatile memory devices and program methods thereof, an integrated circuit memory system includes a memory array comprising at least one magnetic track, each of the at least one magnetic track including a plurality of magnetic domains and at least one read/write unit coupled thereto, decoding circuitry coupled to the memory array that is operable to select at least one of the magnetic domains, a read/write controller coupled to the memory array that is operable to read data from at least one of the plurality of magnetic domains and to write data to at least one of the plurality of magnetic domains via the at least one read/write unit coupled to each of the at least one magnetic track, and a domain controller coupled to memory array that is operable to move data between the magnetic domains on each of the at least one magnetic track.

9 Claims, 17 Drawing Sheets

U.S. PATENT DOCUMENTS

| | | |
|---|---|---|
| 7,477,539 B2 | 1/2009 | Kim et al. |
| 7,817,461 B2 * | 10/2010 | Lee et al. .................. 365/158 |
| 7,855,908 B2 * | 12/2010 | Joe et al. .................... 365/85 |
| 7,986,493 B2 * | 7/2011 | Weller et al. ............... 360/135 |
| 8,194,430 B2 * | 6/2012 | Lim ............................. 365/87 |
| 2007/0194359 A1 | 8/2007 | Lim et al. |
| 2007/0195587 A1 | 8/2007 | Kim et al. |
| 2007/0195588 A1 | 8/2007 | Kim et al. |
| 2007/0198618 A1 | 8/2007 | Kim et al. |
| 2008/0025060 A1 | 1/2008 | Lim et al. |
| 2008/0068880 A1 | 3/2008 | Lim et al. |
| 2008/0068881 A1 | 3/2008 | Lim et al. |
| 2008/0068936 A1 | 3/2008 | Lim et al. |
| 2008/0080092 A1 | 4/2008 | Kim |
| 2008/0094760 A1 | 4/2008 | Lee et al. |
| 2008/0094887 A1 | 4/2008 | Hwang et al. |
| 2008/0100963 A1 | 5/2008 | Lee et al. |
| 2008/0124578 A1 | 5/2008 | Kim et al. |
| 2008/0137395 A1 | 6/2008 | Hwang et al. |
| 2008/0137406 A1 | 6/2008 | Lim et al. |
| 2008/0137521 A1 | 6/2008 | Lee et al. |
| 2008/0138659 A1 | 6/2008 | Lim et al. |
| 2008/0138661 A1 | 6/2008 | Lim |
| 2008/0152794 A1 | 6/2008 | Lim |
| 2008/0152953 A1 | 6/2008 | Lim |
| 2008/0152954 A1 | 6/2008 | Lim |
| 2008/0158710 A1 | 7/2008 | Lim |
| 2008/0160349 A1 | 7/2008 | Lim |
| 2008/0165576 A1 | 7/2008 | Deligianni et al. |

FOREIGN PATENT DOCUMENTS

| | | |
|---|---|---|
| KR | 1020080051766 A | 6/2008 |

* cited by examiner

INTEGRATED CIRCUIT MEMORY SYSTEMS AND PROGRAM METHODS THEREOF INCLUDING A MAGNETIC TRACK MEMORY ARRAY USING MAGNETIC DOMAIN WALL MOVEMENT

CROSS-REFERENCE TO RELATED APPLICATIONS

This U.S. non-provisional patent application claims priority under 35 U.S.C. §119 to Korean Patent Application No. 10-2009-0040291, filed on May 8, 2009 and Korean Patent Application No. 10-2009-0040293, filed on May 8, 2009, the entire contents of each are hereby incorporated herein by reference.

BACKGROUND

The present inventive subject matter relates to information storage devices and methods of operating the same, and, more particularly, to information storage devices using magnetic domain wall movement and methods of operating the same.

In general, examples of conventional nonvolatile information storage devices in which recorded information is retained even when power is cut off include hard disk drives (HDDs) and nonvolatile random access memories (NVRAMs).

An HDD is an information storage device having a rotating part that may wear down over time. If the rotating part of an HDD wears down, an operational failure is likely to occur, thereby lowering the reliability of the HDD. A representative example of a non-volatile RAM is flash memory, which has come into widespread use. However, flash memory generally has relatively slow reading and writing speeds, a relatively short life span, and relatively small storage capacity when compared to an HDD. Flash memories may also have relatively high manufacturing costs.

To solve the problems of such conventional non-volatile information storage devices, new information storage devices that use the principle of magnetic domain wall movement of a magnetic material (hereinafter referred to as "magnetic track memory") have been developed. In these magnetic information storage devices, a minute magnetic region formed of a ferromagnetic substance is referred to as a magnetic domain and a boundary portion between magnetic domains having different magnetization directions is referred to as a magnetic domain wall. The magnetic domains and the magnetic domain walls may be moved by applying current to a magnetic layer. An information storage device using magnetic domain wall movement detects a desired location by moving a domain of a nanowire magnetic track and writes data to or reads data from the detected location.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the inventive subject matter.

According to some embodiments of the present inventive subject matter, an integrated circuit memory system includes a memory array comprising at least one magnetic track, each of the at least one magnetic track including a plurality of magnetic domains and at least one read/write unit coupled thereto, decoding circuitry coupled to the memory array that is operable to select at least one of the magnetic domains, a read/write controller coupled to the memory array that is operable to read data from at least one of the plurality of magnetic domains and to write data to at least one of the plurality of magnetic domains via the at least one read/write unit coupled to each of the at least one magnetic track, and a domain controller coupled to the memory array that is operable to move data between the magnetic domains on each of the at least one magnetic track.

In other embodiments, the memory array comprises a plurality of memory arrays, each of the memory arrays comprising at least one magnetic track, each of the at least one magnetic track comprising a plurality of magnetic domains and at least one read/write unit coupled thereto. A first one of the plurality of memory arrays shares the read/write controller with a second one of the plurality of memory arrays and the first one of the plurality of memory arrays shares the decoding circuitry with a third one of the plurality of memory arrays.

In still other embodiments, each of the at least one read/write unit is coupled to the decoding circuitry via a single control transistor.

In still other embodiments, each of the at least one read/write unit is coupled to the decoding circuitry via a pair of control transistors.

In still other embodiments, each of the at least one magnetic track comprises buffer magnetic domains at opposing ends thereof.

In still other embodiments, each of the at least one magnetic track further comprises at least one buffer magnetic domain between the first and second buffer magnetic domains.

In still other embodiments, the memory array comprises a plurality of memory arrays, each of the memory arrays comprising at least one magnetic track, each of the at least one magnetic track comprising a plurality of magnetic domains and at least one read/write unit coupled thereto. The domain controller comprises a plurality of domain controllers. A first one of the plurality of memory arrays shares the decoding circuitry with a vertically adjacent second one of the plurality of memory arrays. The first one of the plurality of memory arrays shares the read/write controller with a horizontally adjacent third one of the plurality of memory arrays. The first one of the plurality of memory arrays, the second one of the plurality of memory arrays, a fourth one of the plurality if memory arrays, and a fifth one of the plurality of memory arrays share three of the plurality of domain controllers, which are operable to move data between the magnetic domains on each of the at least one magnetic track on the first, second, fourth, and fifth ones of the plurality of memory arrays.

In still other embodiments, the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

In still other embodiments, the memory system is embodied in a graphics card, a computer, a mobile terminal, a Personal Digital Assistant (PDA), a camera, a game console, an MP3 player, a television, a DVD player, a router, or a GPS system.

In further embodiments of the present inventive subject matter, an integrated circuit memory system includes a memory array including at least one magnetic track, each of the at least one magnetic track including a plurality of magnetic domains and at least one read/write unit coupled thereto, decoding circuitry coupled to the memory array that is operable to select the at least one read/write unit coupled to one of the at least one magnetic track, a read/write controller coupled to the memory array that is operable to read data from at least one of the plurality of magnetic domains and to write data to at least one of the plurality of magnetic domains on a selected one of the at least one magnetic track using the at least one read/write unit coupled thereto in parallel and/or individually, and a domain controller coupled to the memory array that is operable to move data between the magnetic domains on each of the at least one magnetic track.

In still further embodiments, each of the at least one read/write unit is coupled to the decoding circuitry via a pair of control transistors and each of the at least one magnetic track is coupled to the domain controller via a pair of selection transistors; wherein the pair of control transistors and the pair of selection transistors are responsive to a common control/selection signal.

In still further embodiments, each of the at least one magnetic track comprises buffer magnetic domains at opposing ends thereof.

In still further embodiments, each of the at least one magnetic track comprises at least one buffer magnetic domain between the buffer magnetic domains at opposing ends of the at least one magnetic track.

In still further embodiments, each of the at least one read/write unit is coupled to the decoding circuitry via a single control transistor and each of the at least one magnetic track is coupled to the domain controller via a pair of selection transistors. The single control transistor is responsive to a control signal and the pair of selection transistors is responsive to a selection signal, the control signal and the selection signal being different signals.

In still further embodiments, each of the at least one read/write unit is coupled to the decoding circuitry via a single control transistor and each of the at least one magnetic track is coupled to the domain controller via a pair of selection transistors. The single control transistor and the pair of selection transistors are responsive to a common control/selection signal.

In still further embodiments, each of the at least one read/write unit is coupled to the decoding circuitry via a pair of control transistors and each of the at least one magnetic track is coupled to the domain controller via a pair of selection transistors. The pair of control transistors is responsive to a control signal and the pair of selection transistors is responsive to a selection signal, the control signal and the selection signal being different signals.

In still further embodiments, the memory array comprises a plurality of memory arrays, each of the memory arrays comprising at least one magnetic track, each of the at least one magnetic track comprising a plurality of magnetic domains and at least one read/write unit coupled thereto. The domain controller comprises a plurality of domain controllers. A first one of the plurality of memory arrays shares a sense amplifier/write driver with a vertically adjacent second one of the plurality of memory arrays. The first one of the plurality of memory arrays shares the decoding circuitry with a horizontally adjacent third one of the plurality of memory arrays. The first one of the plurality of memory arrays, the second one of the plurality of memory arrays, a fourth one of the plurality if memory arrays, and a fifth one of the plurality of memory arrays share three of the plurality of domain controllers, which are operable to move data between the magnetic domains on each of the at least one magnetic track on the first, second, fourth, and fifth ones of the plurality of memory arrays.

In still further embodiments, the memory array comprises a plurality of memory arrays, each of the memory arrays comprising at least one magnetic track, each of the at least one magnetic track comprising a plurality of magnetic domains and at least one read/write unit coupled thereto. The domain controller comprises a plurality of domain controllers. A first one of the plurality of memory arrays shares a first partial bit line decoder/read-write unit with a first vertically adjacent second one of the plurality of memory arrays. The first one of the plurality of memory arrays shares a second partial bit line decoder/read-write unit with a second vertically adjacent third one of the plurality of memory arrays. The first one of the plurality of memory arrays shares the decoding circuitry with a horizontally adjacent fourth one of the plurality of memory arrays. The first one of the plurality of memory arrays, the second one of the plurality of memory arrays, a fifth one of the plurality if memory arrays, and a sixth one of the plurality of memory arrays share three of the plurality of domain controllers, which are operable to move data between the magnetic domains on each of the at least one magnetic track on the first, second, fifth, and sixth ones of the plurality of memory arrays.

In still further embodiments, the memory array comprises a plurality of memory arrays, each of the memory arrays comprising at least one magnetic track, each of the at least one magnetic track comprising a plurality of magnetic domains and at least one read/write unit coupled thereto. The domain controller comprises a plurality of domain controllers. The plurality of memory arrays has a plurality of local sensing line decoders associated therewith, respectively. A first one of the plurality of memory arrays shares a selection line decoder with a horizontally adjacent second one of the plurality of memory arrays. Vertically adjacent ones of the plurality of memory arrays have common global bit lines associated therewith. The plurality of memory arrays is associated with a global sensing line decoder and a global sense amplifier/write driver. The first one of the plurality of memory arrays, the second one of the plurality of memory arrays, a third one of the plurality if memory arrays, and a fourth one of the plurality of memory arrays share three of the plurality of domain controllers, which are operable to move data between the magnetic domains on each of the at least one magnetic track on the first, second, third, and fourth ones of the plurality of memory arrays.

In still further embodiments, the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

In still further embodiments, the memory system is embodied in a graphics card, a computer, a mobile terminal, a Personal Digital Assistant (PDA), a camera, a game console, an MP3 player, a television, a DVD player, a router, or a GPS system.

In other embodiments of the present inventive subject matter, an integrated circuit memory system is operated by performing a program operation to write data in a memory array comprising at least one magnetic track, performing a verify operation of the data written in the memory array, and increasing program current in a subsequent program operation if the verify operation indicates the program operation failed.

In still other embodiments, increasing the program current comprises increasing a duration of a programming pulse.

In still other embodiments, increasing the program current comprise increasing a voltage level of a programming pulse.

In still other embodiments, the integrated circuit memory system comprises a temperature sensor, the method further comprising adjusting a read and/or write current used to read and/or write data to and/or from the memory array based on a temperature measured by the temperature sensor.

In still other embodiments, adjusting the read and/or write current comprises adjusting a time the read and/or write current is applied.

BRIEF DESCRIPTION OF THE FIGURES

The accompanying figures are included to provide a further understanding of the present inventive subject matter and are incorporated in and constitute a part of this specification. The drawings illustrate exemplary embodiments of the present inventive subject matter and, together with the description, serve to explain principles of the present inventive subject matter. In the figures.

DETAILED DESCRIPTION

Figure 1:
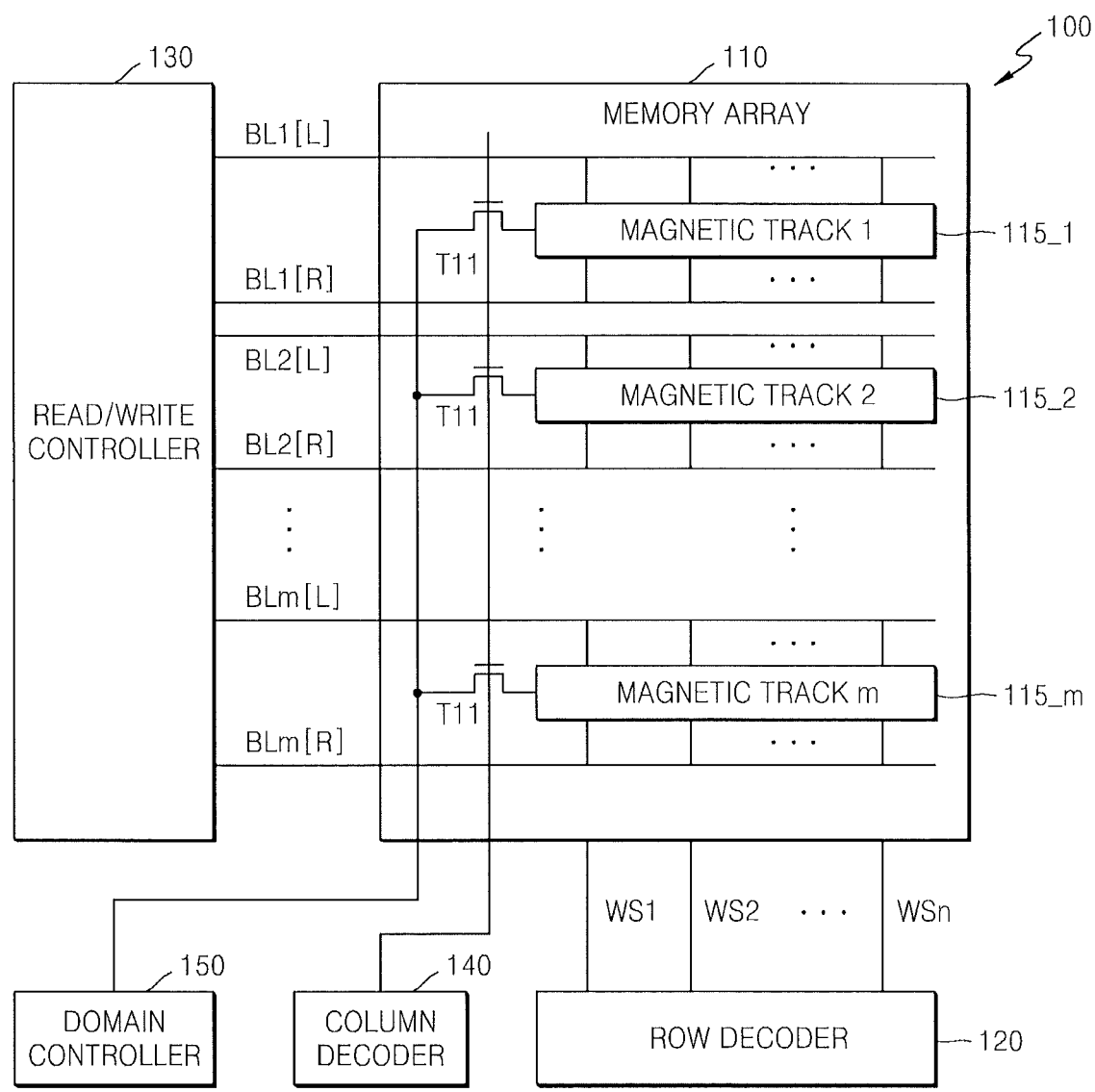
FIG. 1 is a block diagram of an integrated circuit memory system including an information storage device using magnetic domain wall movement according to some embodiments of the present inventive subject matter.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

For purposes of illustration, various embodiments of the present invention are described herein with reference to a memory system and/or data storage device comprising a magnetic track memory. The memory system and/or data storage device may comprise a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) device.

Hereinafter, exemplary embodiments of the present inventive subject matter will be described in detail with reference to the accompanying drawings.

FIG. 1 is a block diagram of an integrated circuit memory system comprising an information storage device 100 using magnetic domain wall movement, according to some embodiments of the present inventive concept. Referring to FIG. 1, the information storage device 100 according to the present inventive concept comprises a memory unit 110 including a memory array having a plurality of nanowire magnetic tracks 115_1-115_m, a plurality of write/read units (not shown) disposed to respectively correspond to the magnetic tracks to write data to or read data from magnetic domains of the magnetic tracks (not shown), and a write/read controller 130 that drives the write/read units (not shown) to control write/read operations performed on the magnetic domains. Although not shown, the memory unit 110 may include a plurality of memory blocks. The information storage device 100 further comprises a row/selection decoder 120 that receives and decodes a predetermined address to select either one of the write/read units on any selected magnetic track, a column decoder or block selection controller 140 that selects at least one magnetic track from the magnetic tracks 115_1-115_m of the memory unit 110, and a domain controller 150 that controls movement of magnetic domains of the magnetic tracks.

Each of the magnetic tracks 115_1-115_m included in the memory unit 110 comprises a plurality of magnetic domains for storing data. Magnetic domain walls may be disposed between adjacent magnetic domains. The magnetic tracks may be formed of a ferromagnetic material or a hard magnetic material. A magnetic track may be disposed to be parallel with a substrate (not shown) and may have perpendicularly magnetic anisotropic characteristics. For example, the magnetic tracks may be multi-level tracks in which a first layer comprises at least one material selected from the group of materials consisting of Co and a Co alloy and a second layer comprising at least one material selected from the group of materials consisting of Pt, Ni, and Pd are alternately formed. In other embodiments, the magnetic tracks may comprise FePt layers or CoPt layers having an L10 structure, or may be layers formed of an alloy of a rare-earth element and a transition metal. The magnetic anisotropic energy density K of the magnetic tracks may be about $10^3 \leq K \leq 10^7$ J/m$^3$. The width of magnetic domain walls disposed within a track formed of a hard magnetic material (hereinafter referred to as a "hard magnetic track") may be about several to several tens of nanometers (nm). A current density of $10^{11}$ A/m$^2$ or less required to move magnetic domain walls in a hard magnetic track is typically less than a current density of about $10^{12}$ A/m$^2$ required to move magnetic domain walls within a soft magnetic track. Also, information written to a hard magnetic track can typically withstand heat better than information written to a soft magnetic track.

Figure 2:
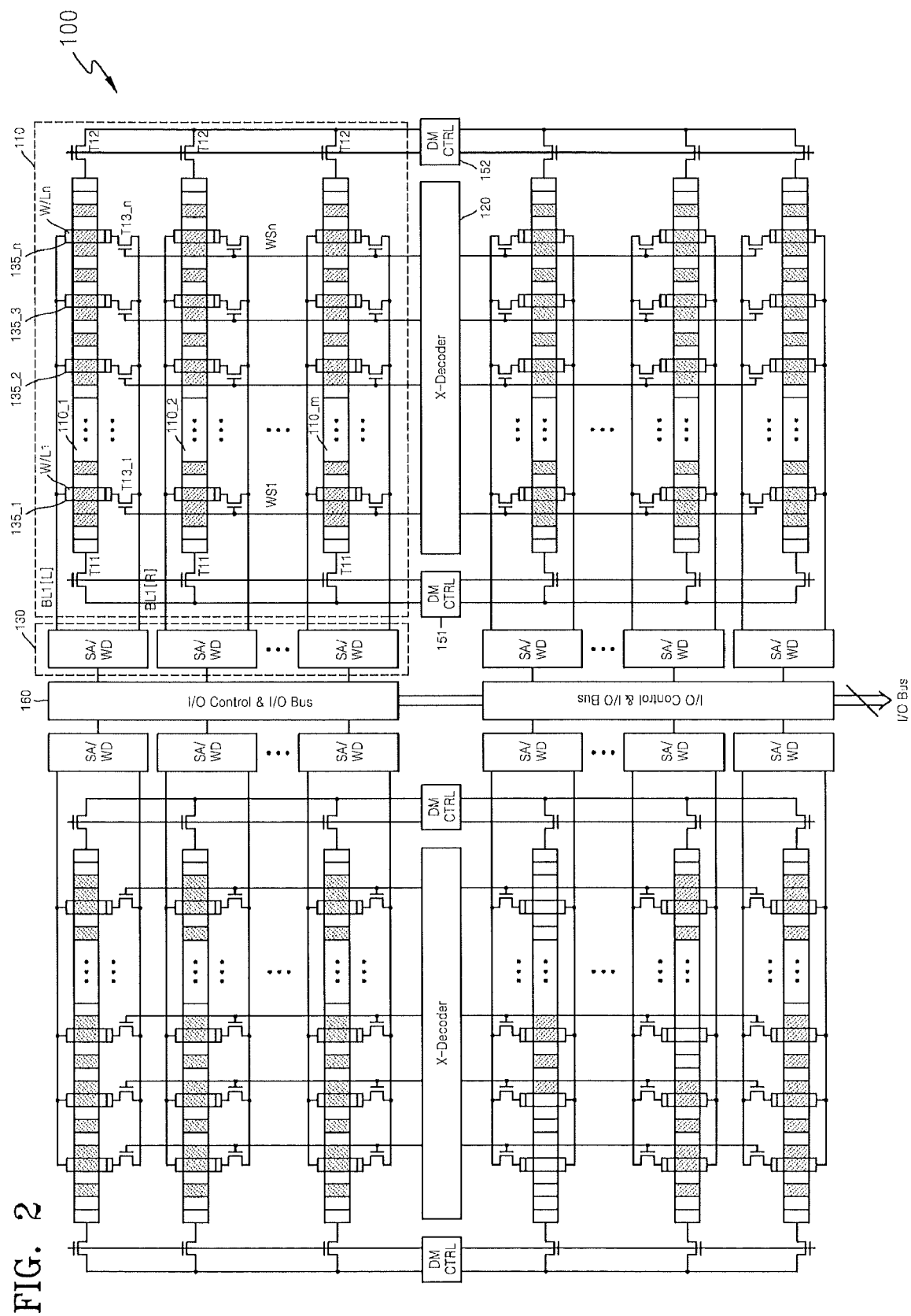
FIG. 2 is a schematic of the information storage device of FIG. 1 in which multiple memory units/memory arrays are used according to some embodiments of the present inventive subject matter.

FIG. 2 is a schematic of the information storage device 100 in which multiple memory units/memory arrays 110 are used. Referring to FIG. 2, the information storage device 100 according to some embodiments of the present inventive subject matter comprises a plurality of memory units 110, and may comprise a plurality of row decoders 120, a plurality of write/read controllers 130, a plurality of first and second domain controllers 151 and 152, and a plurality of input/output (I/O) controllers 160 to drive the memory units.

Also, as described above, each of the memory units may comprise a plurality of magnetic tracks. For example, a first memory unit 110 includes m magnetic tracks 110_1 through 110_m.

In write/read units W/L1 to W/Ln (135_1-135_m) may be arranged in each of a plurality of memory tracks included in the first memory unit 110. The n write/read units W/L_1 to W/L_n (135_1-135_m) may be arranged at equal intervals in each of the magnetic tracks. To select the n write/read units W/L1 to W/Ln (135_1-135_m), the corresponding row decoder 120 generates first to n$^{th}$ word line signals WS1 to WSn and supplies them to gates of the n write/read units W/L1 to W/L n (135_1-135_m), respectively.

In the first memory unit 110 according to some embodiments of the present inventive subject matter, control transistors T13_1 to T13_n are disposed between a bit line BL1(R) and a first magnetic track 110_1 as shown. The other magnetic tracks 110_2 through 110_m are configured similarly. The control transistors may be controlled in response to the word line signals WS1 to WSn.

To select the magnetic tracks 110_1 to 110_m, a plurality of selection signals are supplied thereto, respectively. Referring to FIG. 2, the first and second domain controllers 151 and 152 generate selection signals to select the magnetic tracks 110_1 to 110_m via selection transistors T11 and T12 in response to an external address. However, as described above, the information storage device 100 may further include a column decoder (not shown) to receive the external address and to generate the selection signals.

When a peripheral circuit is used to drive the memory units 110, the peripheral circuit may be arranged to be shared by at least two memory units from among the memory units 110. Referring to FIG. 2, one of the row decoders 120 may not only drive the first memory unit 110 but also supply word line signals to other memory units. For example, the row decoder 120 may also be used to drive a memory unit that is vertically adjacent to the first memory unit 110. Similarly, the write/read controllers 130 and the first and second domain controllers 151 and 152 may also be commonly used by at least two memory units.

Referring to FIG. 2, each of the I/O controllers 160 is connected to at least one of the write/read units W/L1 to W/Ln (135_1-135_m). Operations of the I/O controller 160 will now be described with respect to the write/read controller 130.

The I/O controller 160 receives write data from the outside and supplies it to the write/read controller 130, or receives read data from the write/read controller 130 and supplies it to the outside. The I/O controller 160 may include an I/O bus to supply predetermined bit data, and may include a controller, e.g., a switch unit (not shown), to control the supply of data via the I/O bus. For example, if the I/O bus is capable of transmitting a plurality of pieces of 16-bit data in parallel, the I/O controller 160 divides m-bit data read from the first memory unit 110 into several pieces of 16-bit data and delivers them to the outside sequentially. In a write operation, the I/O bus divides write data, which is received from the outside, into several pieces of 16-bit data and delivers them to the write/read controller 130 sequentially.

Figure 3A:
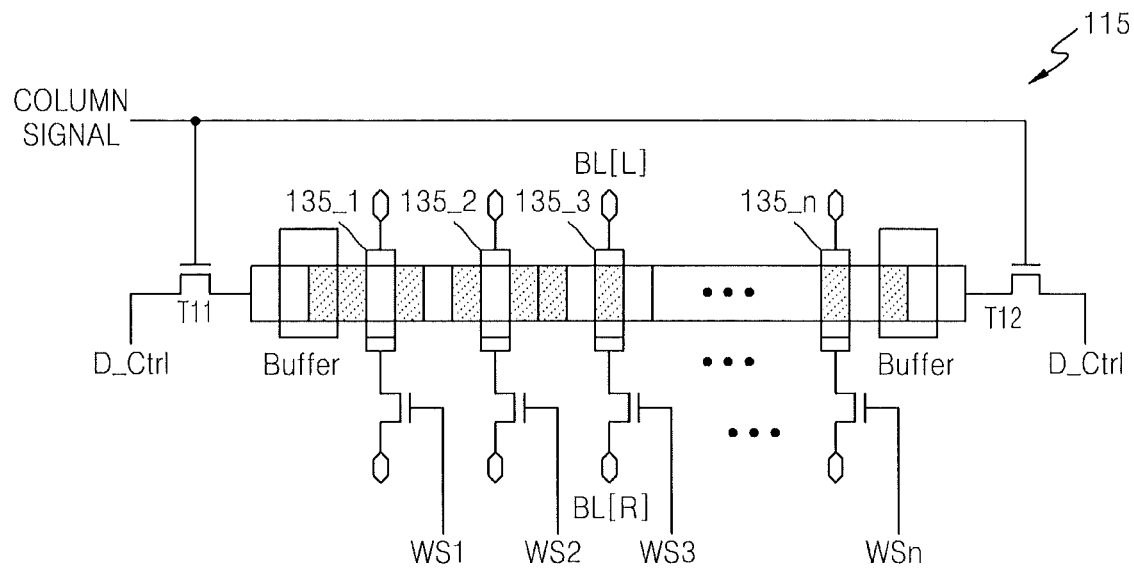
FIGS. 3A-3C are circuit diagrams of magnetic tracks used in the information storage devices of FIGS. 1 and 2 according to some embodiments of the present inventive subject matter.

FIG. 3A is a circuit diagram of a magnetic track 115 and selection transistors T11 and T12 that are included in the memory unit 110 included in the information storage device 100 of FIGS. 1 and 2, according to some embodiments of the present inventive subject matter. Referring to FIG. 3A, one control transistor may be disposed to correspond to one write/read unit. For example, when n write/read units (135_1-135_m) are disposed to correspond to one magnetic track, first to n$^{th}$ word line signals WS1 to WSn are supplied to gates of n control transistors, respectively. First and second transistors T11 and T12 may be disposed as selection transistors at both ends of the magnetic track. A block selection signal (Column signal) may be supplied to gates of the first and second transistors T11 and T12 to control selection of magnetic tracks, and a domain control signal D_Ctrl may be supplied to drain electrodes of the first and second transistors T11 and T12.

Because an information storage device according to some embodiments of the present inventive subject matter stores data by using magnetic domain movement, a buffer may be included in each of a plurality of magnetic tracks to temporarily store data. For example, a buffer magnetic domain may be disposed at one end of each of the magnetic tracks, at both ends of each of the magnetic tracks, or between both ends of each of the magnetic tracks. When one write/read unit performs a write/read operation on a magnetic domains, the buffer may have a or more magnetic domains. FIG. 3A illustrates that two buffers are disposed at both ends of the magnetic track, respectively, and in this case, the buffers may include a/2 or more magnetic domains.

Figure 3B:
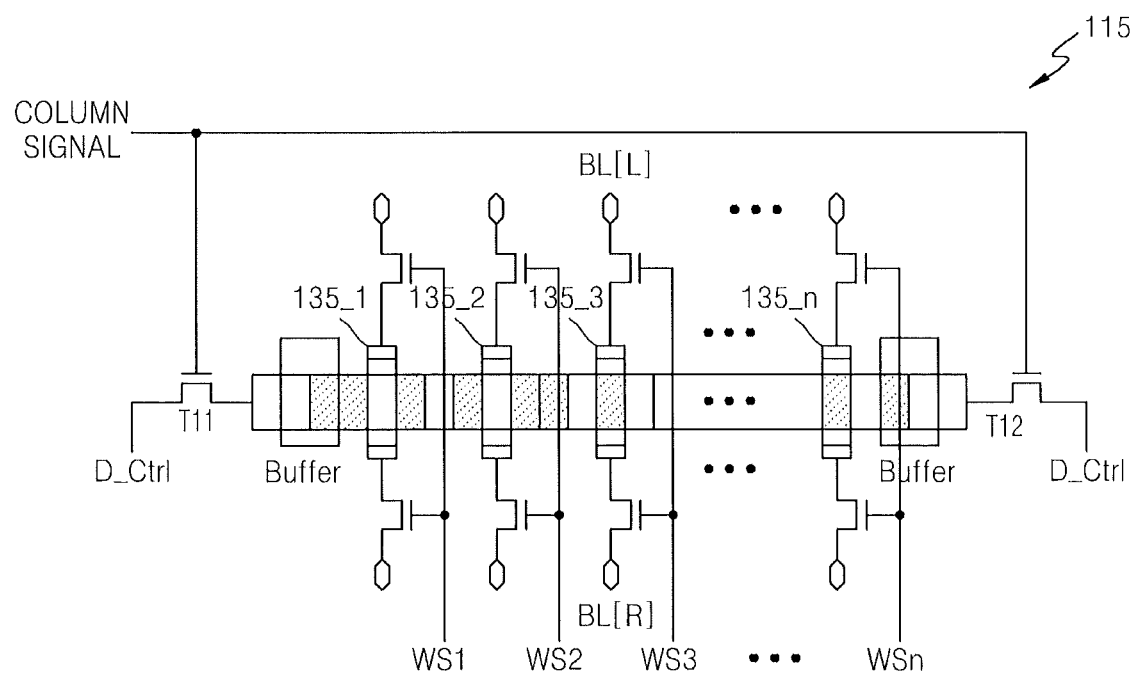

FIG. 3B is a circuit diagram of a magnetic track 115 and selection transistors T11 and T12 that are included in the memory unit 110 included in the information storage device 100 of FIGS. 1 and 2, according to another embodiment of the present inventive subject matter. FIG. 3B illustrates that two control transistors are disposed to correspond to each of a plurality of write/read units (135_1-135_m), respectively. Each control transistor pair is controlled in response to the same word line signal. For example, when first control transistors are respectively disposed at both ends of a first write/read unit, a first word line signal WS1 is commonly supplied to gates of the first control transistors. First and second transistors T11 and T12 may be disposed as selection transistors at both ends of the magnetic track. A block selection signal (Column signal) may be supplied to gates of the first and second transistors T11 and T12 to control selection of magnetic tracks, and a domain control signal D_Ctrl may be supplied to drain electrodes of the first and second transistors T11 and T12.

According to the embodiment of FIG. 3B, it may be possible to reduce noise effects when a write/read operation is performed. For example, in a write operation, write current is supplied from one of a pair of bit lines to a magnetic track, and then to the other bit line. As illustrated in FIG. 3B, when each of a plurality of write/read units has two control transistors associated therewith, it may be possible to eliminate or reduce write current from being supplied to another write/read unit (a write/read unit that is not selected) via the magnetic track.

Figure 3C:
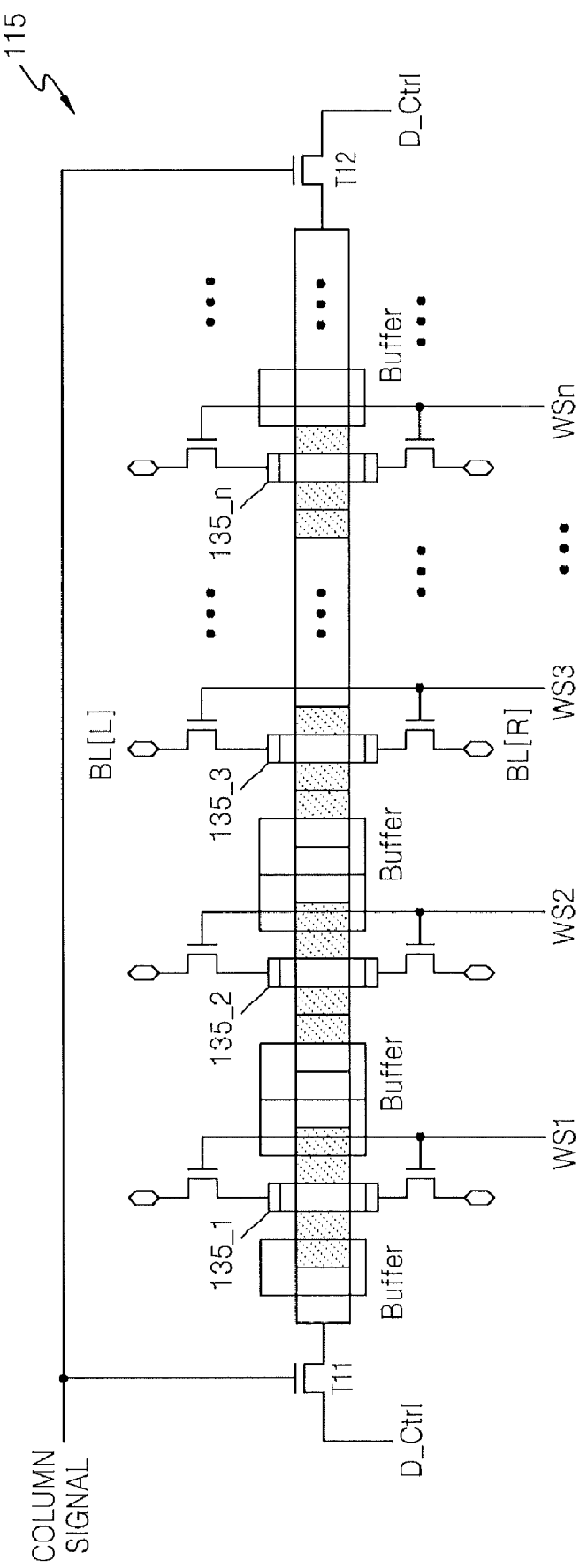

FIG. 3C is a circuit diagram of a magnetic track 115 and selection transistors T11 and T12 that are included in the memory unit 110 included in the information storage device 100 of FIGS. 1 and 2, according to still further embodiments of the present inventive subject matter. The embodiment of FIG. 3C is similar to the embodiment of FIG. 3B with the exception that FIG. 3C shows the magnetic track may comprise at least one buffer magnetic domain disposed between respective write/read units (135_1-135_m) and/or buffer magnetic domains disposed at opposing ends thereof.

Figure 4:
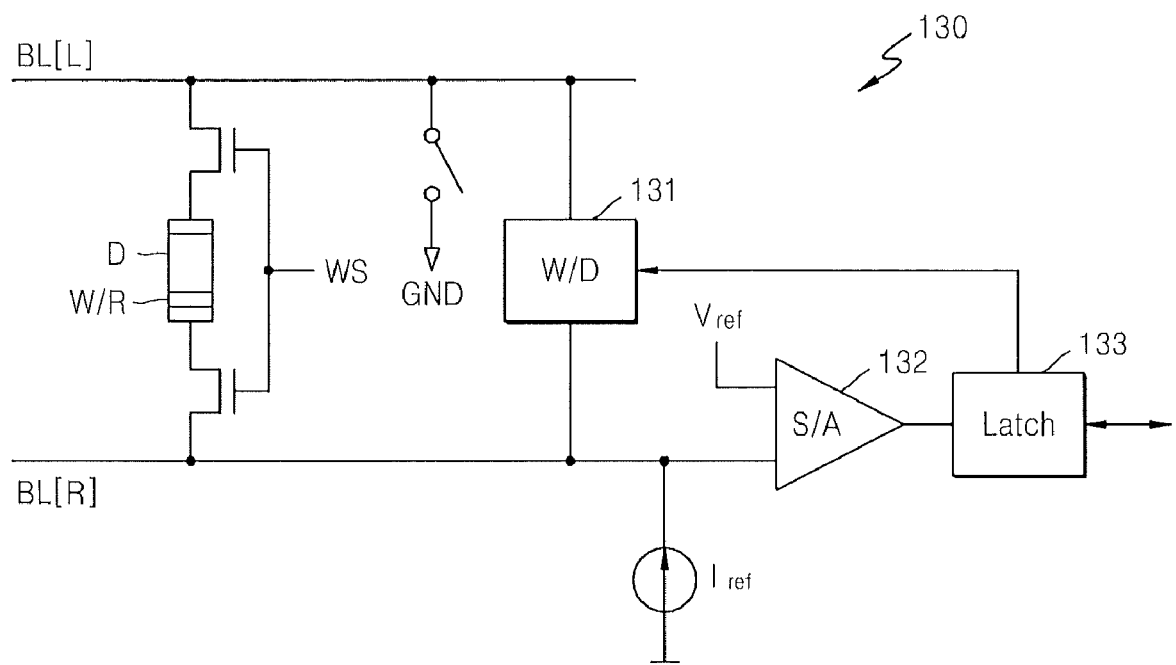
FIG. 4 is a circuit diagram of the read/write controller of FIGS. 1 and 2 according to some embodiments of the present inventive subject matter.

FIG. 4 is a circuit diagram of the read/write controller 130 of FIGS. 1 and 2 according to some embodiments of the present inventive subject matter.

Referring to FIG. 4, the read/write controller 130 may comprise a write driver 131, a sense amplifier 132, and a latch 133. The read/write controller 130 is connected to a bit line BL[L] and a BL[R] that are disposed to correspond to a magnetic domain. The read/write controller may further comprise a current source that generates read current Iref for reading data.

In a write operation, write data, e.g., 1-bit data, which is stored in the latch 133 is supplied to the write driver 131. The write driver 131 generates write current in response to the write data. For example, the write driver 131 generates write current that flows from the bit line BL[L] to the bit line BL[R] or from the complementary bit line BL[R] to the bit line BL[L], according to the state of the write data.

In the read operation, when read current Iref is supplied to the bit line BL[R], the read current Iref flows sequentially to a first control transistor, a magnetic domain D of a first magnetic track, a second control transistor, and finally to a ground voltage source GND. Thus, a voltage of the bit line BL[R] is determined by the read current Iref and a resistance of the magnetic domain D. The sense amplifier 132 senses and amplifies the voltages of the bit line BL[R] and the reference voltage Vref. The sensing result is temporarily stored in the latch 133 and is provided as read data to the outside.

Figure 5:
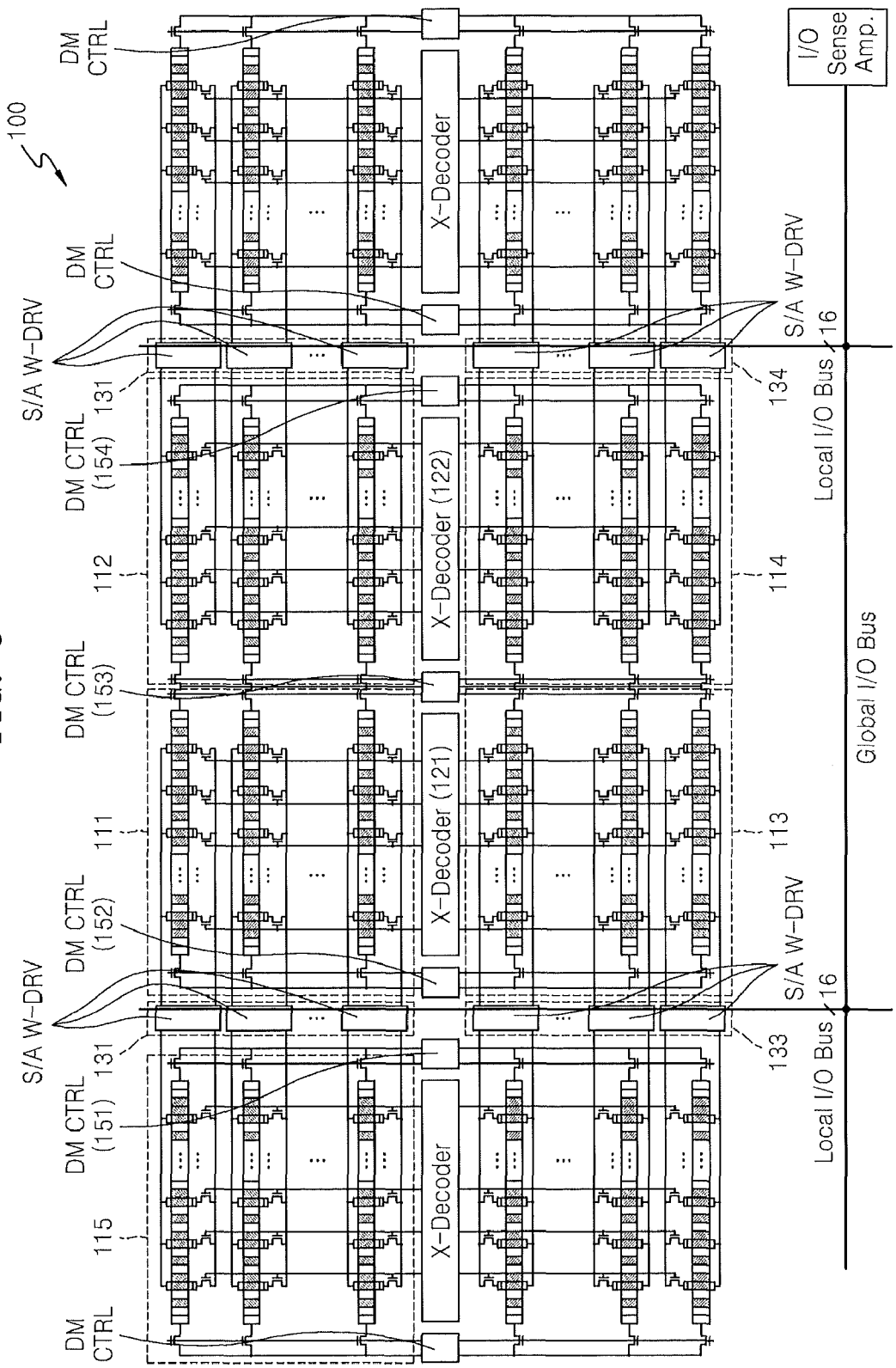
FIG. 5 is a schematic of the information storage device of FIG. 1 in which multiple memory units/memory arrays are used according to some embodiments of the present inventive subject matter.

FIG. 5 is a schematic of the information storage device 100 in which multiple memory units/memory arrays are used according to some embodiments of the present inventive subject matter. Referring to FIG. 5, the information storage device 100 according to some embodiments of the present inventive subject matter comprises a plurality of memory units 111, 112, 113, 114, and 115, and may comprise a plurality of row decoders 121 and 122, a plurality of write/read controllers 131, 132, 133, and 134, and a plurality of domain controllers 151, 152, 153, and 154 that are configured as shown.

As shown in FIG. 5, memory units vertically adjacent to one another may share the same row decoder, e.g., memory units 111 and 113 share row decoder 121. Four memory units may also share three domain controllers, e.g., memory units 111, 112, 113, and 114 share domain controllers 152, 153, and 154. Memory units may also share a write/read controller with horizontally adjacent memory units, e.g., memory units 111 and 115 share write/read controller 131.

Figure 6:
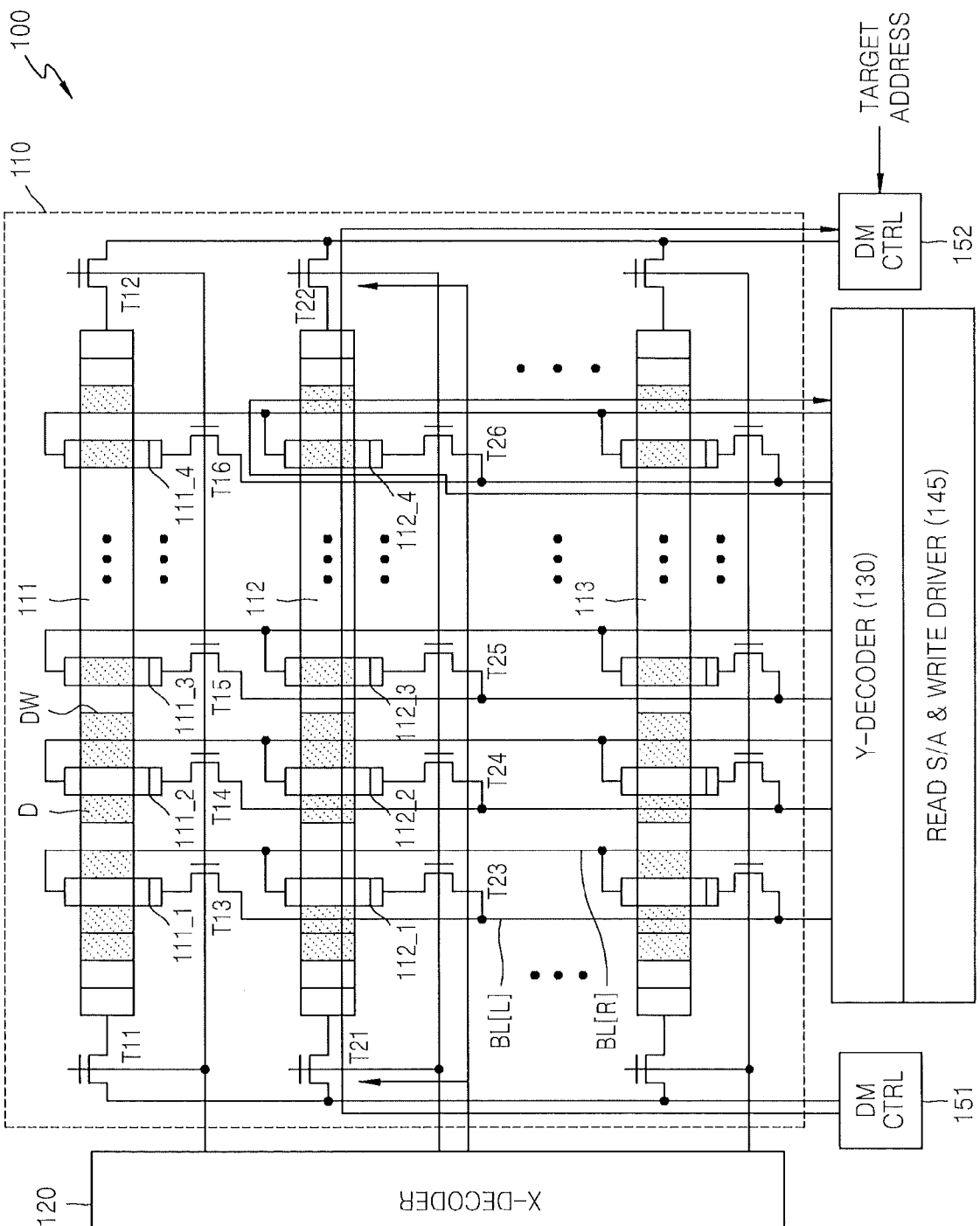
FIG. 6 is a schematic of an information storage device in which nanowire magnetic tracks are activated and write/read units are decoded in parallel or individually according to some embodiments of the present inventive subject matter.

FIG. 6 is a schematic of the information storage device 100 in which the nanowire magnetic tracks are activated and the write/read units are decoded in parallel or individually according to some embodiments of the present inventive subject matter. Referring to FIG. 6, the information storage device 100 according to some embodiments of the present inventive subject matter comprises a memory unit 110, and may comprise a row/bit-line/selection line decoder (X-DECODER) 120, a bit line/sensing line decoder (Y-DECODER) 130, a sense amplifier/write driver 145, and first and second domain controllers 151 and 152. Also, as described above with reference to FIGS. 1 and 2, the memory unit may comprise a plurality of magnetic tracks 111, 112, . . . 113.

In contrast to the configuration of the information storage device 100 of FIGS. 1 and 2, all of the control transistors associated with a single magnetic track are responsive to a common selection line. As shown in FIG. 6, control transistors T13, T14, T15, and T16 have their gate terminals connected to a common selection line. Control transistors T23, T24, T25, and T26 are configured in a similar manner as control transistors T13, T14, T15, and T16. Rather than using a separate column decoder 140 as shown in FIG. 1, the gates of the selection transistors T11 and T12 are also connected to the common selection line that connects the gate terminals of the control transistors T13, T14, T15, and T16 together. Selection transistors T21 and T22 are configured in a similar manner as selection transistors T11 and T12. The first and second domain controllers 151 and 152 generate selection signals to select the magnetic tracks via selection transistors T11, T12, T21, T22, . . . in response to an external address.

Figure 7A:
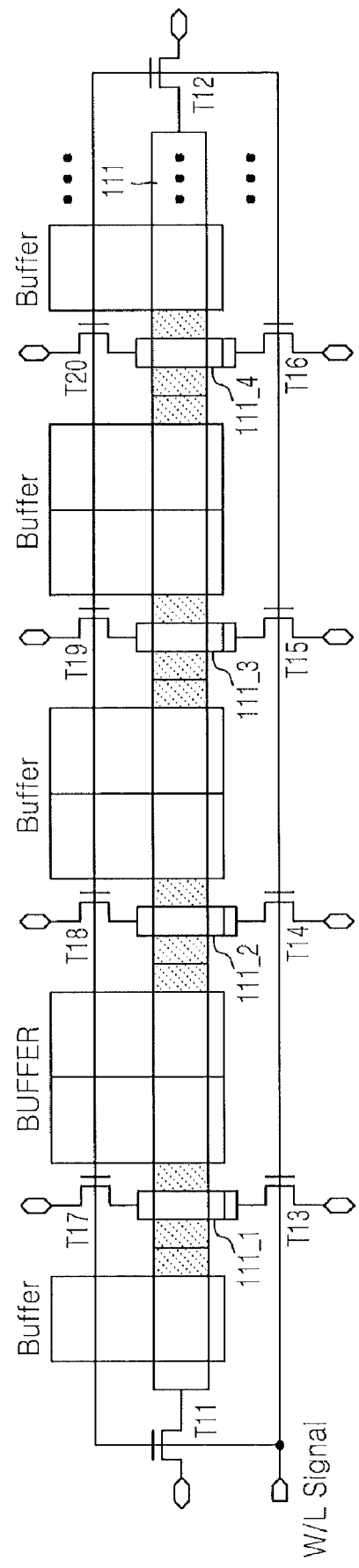
FIGS. 7A-7E are circuit diagrams of magnetic tracks used in the information storage device of FIG. 6 according to some embodiments of the present inventive subject matter.

FIG. 7A is a circuit diagram of a magnetic track 111, control transistors T13~T16 and T17~T20, and selection transistors T11 and T12 that are included in the memory unit 110 included in the information storage device 100 of FIG. 6, according to some embodiments of the present inventive subject matter. FIG. 7A illustrates that two control transistors are disposed to correspond to each of a plurality of write/read units 111_1, . . . 111_4, respectively. Each control transistor pair is controlled in response to the same word line signal (W/L). First and second transistors T11 and T12 may be disposed as selection transistors at both ends of the magnetic track 111. As shown in FIG. 7A, the selection transistors T11 and T12 are also responsive to the word line signal W/L used to drive the control transistors T13 through T20. Thus, the word line signal W/L may be viewed as a common control/ selection signal that is used to drive the control transistors T13 through T20 and the selection transistors T11 and T12, to select the magnetic track 111.

Because an information storage device according to some embodiments of the present inventive subject matter stores data by using magnetic domain movement, a buffer may be included in each of a plurality of magnetic tracks to temporarily store data. For example, a buffer magnetic domain may be disposed at one end of each of the magnetic tracks, at both ends of each of the magnetic tracks, or between both ends of each of the magnetic tracks. When one write/read unit performs a write/read operation on a magnetic domains, the buffer may have a or more magnetic domains. FIG. 7A illustrates that buffers are disposed at both ends of the magnetic track 111, respectively, and also buffers are disposed between each of the write/read units 111_1 through 111_4.

Figure 7B:
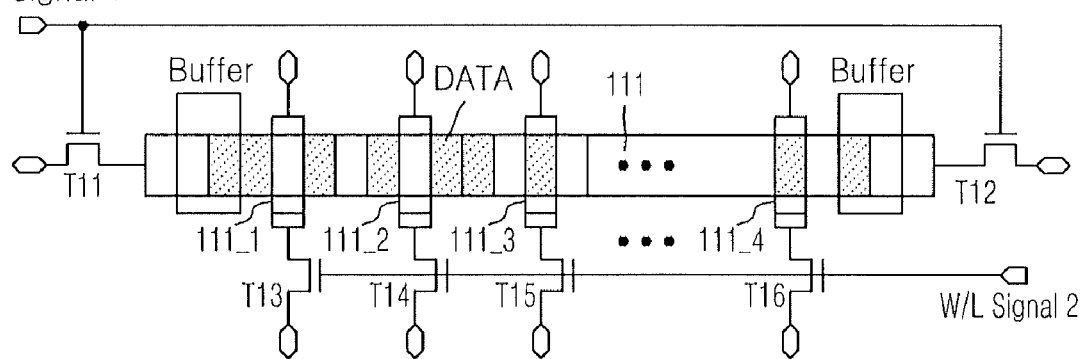

FIG. 7B is a circuit diagram of a magnetic track 111, control transistors T13, ... T16, and selection transistors T11 and T12 that are included in the memory unit 110 included in the information storage device 100 of FIG. 6, according to further embodiments of the present inventive subject matter. FIG. 7B illustrates that one control transistor is disposed to correspond to each of a plurality of write/read units 111_1, . . . 111_4, respectively. Each control transistor is controlled in response to the same word line signal (W/L Signal 2). First and second transistors T11 and T12 may be disposed as selection transistors at both ends of the magnetic track 111. As shown in FIG. 7B, the selection transistors T11 and T12 are responsive to another word line signal (W/L Signal 1). Thus, the word line signal W/L Signal 2 may be viewed as a common control signal that is used to drive the control transistors T13 through T16 and the word line signal W/L Signal 1 may be viewed as a selection signal that is used to select the magnetic track 111.

Figure 7C:
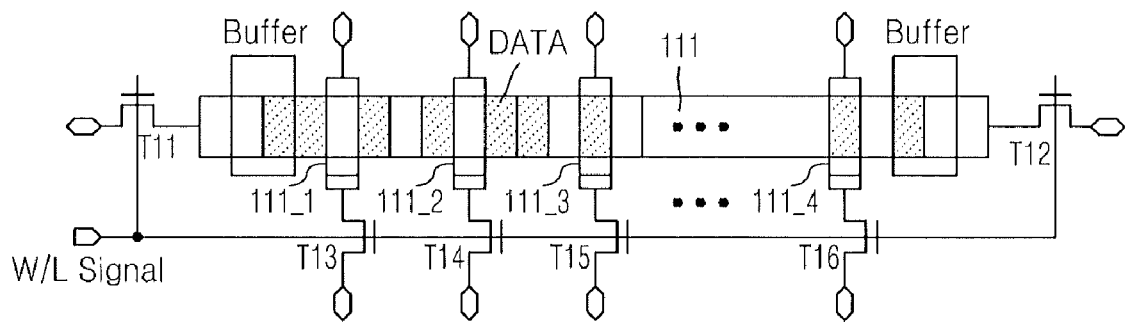

FIG. 7C is a circuit diagram of a magnetic track 111, control transistors T13, ... T16, and selection transistors T11 and T12 that are included in the memory unit 110 included in the information storage device 100 of FIG. 6, according to further embodiments of the present inventive subject matter. FIG. 7C illustrates that one control transistor is disposed to correspond to each of a plurality of write/read units 111_1, . . . 111_4, respectively. Each control transistor is controlled in response to the same word line signal (W/L). First and second transistors T11 and T12 may be disposed as selection transistors at both ends of the magnetic track 111. As shown in FIG. 7C, the selection transistors T11 and T12 are responsive to the same word line signal (W/L) that are used to drive the control transistors T13 through T16. Thus, the word line signal W/L may be viewed as a common control/selection signal that is used to drive the control transistors T13 through T16 and the selection transistors T11 and T12, to select the magnetic track 111.

Figure 7D:
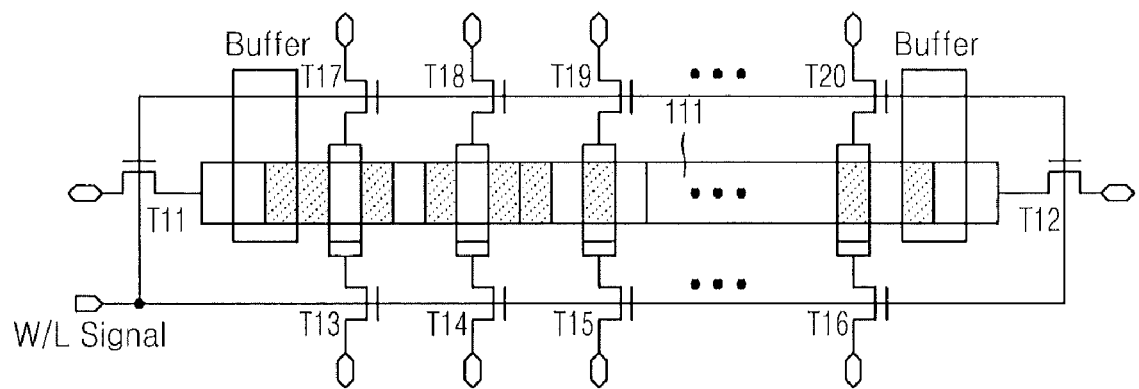

FIG. 7D is a circuit diagram of a magnetic track 111, control transistors T13, ... T20, and selection transistors T11 and T12 that are included in the memory unit 110 included in the information storage device 100 of FIG. 6, according to further embodiments of the present inventive subject matter. FIG. 7D illustrates that two control transistors are disposed to correspond to each of a plurality of write/read units, respectively. Each control transistor pair is controlled in response to the same word line signal (W/L). First and second transistors T11 and T12 may be disposed as selection transistors at both ends of the magnetic track 111. As shown in FIG. 7D, the selection transistors T11 and T12 are also responsive to the word line signal W/L used to drive the control transistors T13 through T20. Thus, the word line signal W/L may be viewed as a common control/selection signal that is used to drive the control transistors T13 through T20 and the selection transistors T11 and T12, to select the magnetic track 111. The embodiments of 7D are similar to the embodiments of FIG. 7A with the exception that the buffers are disposed at both ends of the magnetic track 111, but are not disposed between each of the write/read units.

Figure 7E:
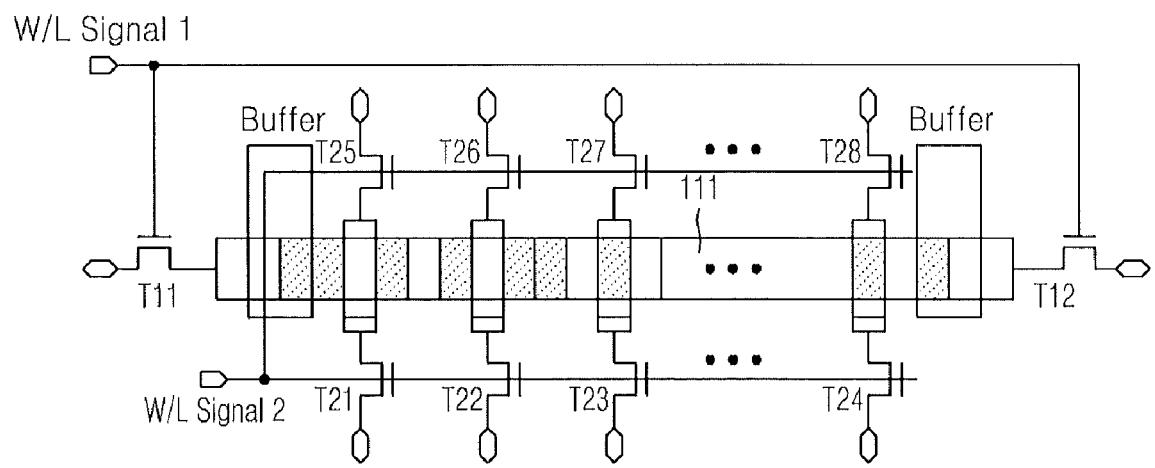

FIG. 7E is a circuit diagram of a magnetic track 111, control transistors T21, ... T28, and selection transistors T11 and T12 that are included in the memory unit 110 included in the information storage device 100 of FIG. 6, according to further embodiments of the present inventive subject matter. FIG. 7E illustrates that illustrates that two control transistors are disposed to correspond to each of a plurality of write/read units, respectively. Each control transistor pair is controlled in response to the same word line signal (W/L 2). First and second transistors T11 and T12 may be disposed as selection transistors at both ends of the magnetic track 111. As shown in FIG. 7E, the selection transistors T11 and T12 are responsive to another word line signal (W/L1). Thus, the word line signal W/L 2 may be viewed as a common control signal that is used to drive the control transistors T21 through T28 and the word line signal W/L 1 may be viewed as a selection signal that is used to select the magnetic track 111.

Figure 8:
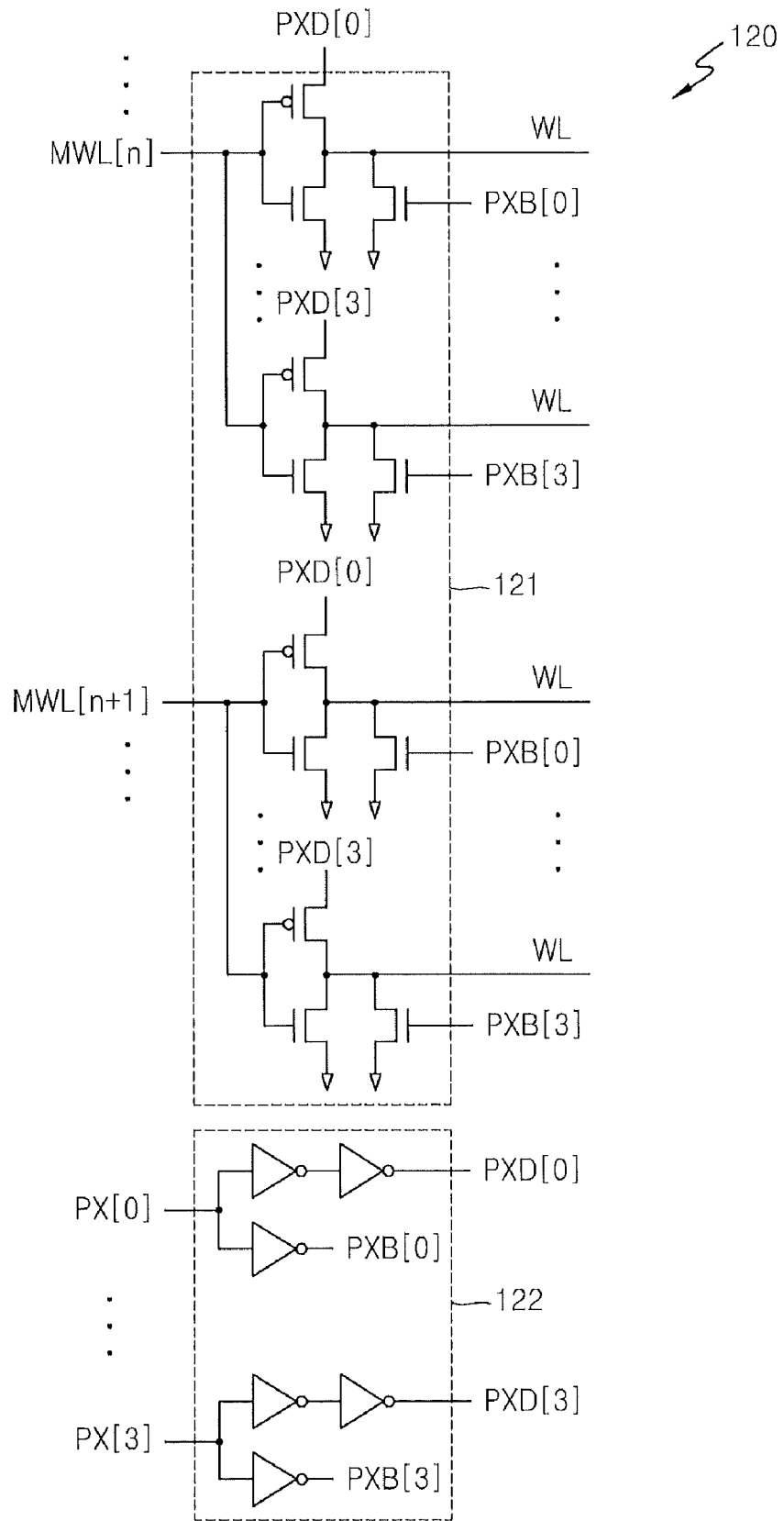
FIG. 8 is a circuit diagram of the selection line decoder of the information storage device of FIG. 6 according to some embodiments of the present inventive subject matter.

FIG. 8 is a circuit diagram of the row/bit-line/selection line decoder 120 of FIG. 6 according to some embodiments of the present inventive subject matter. The row decoder 120 may comprise a main decoder circuit 121 and a pre-decoder circuit 122. The main decoder 121 may include logic circuits to generate four word line signals WL based on each main word line signal MWL[n], four pre-decoded drain signals PXD[0] ~PXD[3], and four pre-decoded gate signals PXD[0]~PXD [3]. The pre-decoder circuit 122 includes logic to generate the pre-decoded drain and gate signals based on pre-decoder input signals PXD[0]~PXD[3]. The pre-decoded drain signals and pre-decoded gate signals are complementary of each other.

Figure 9:
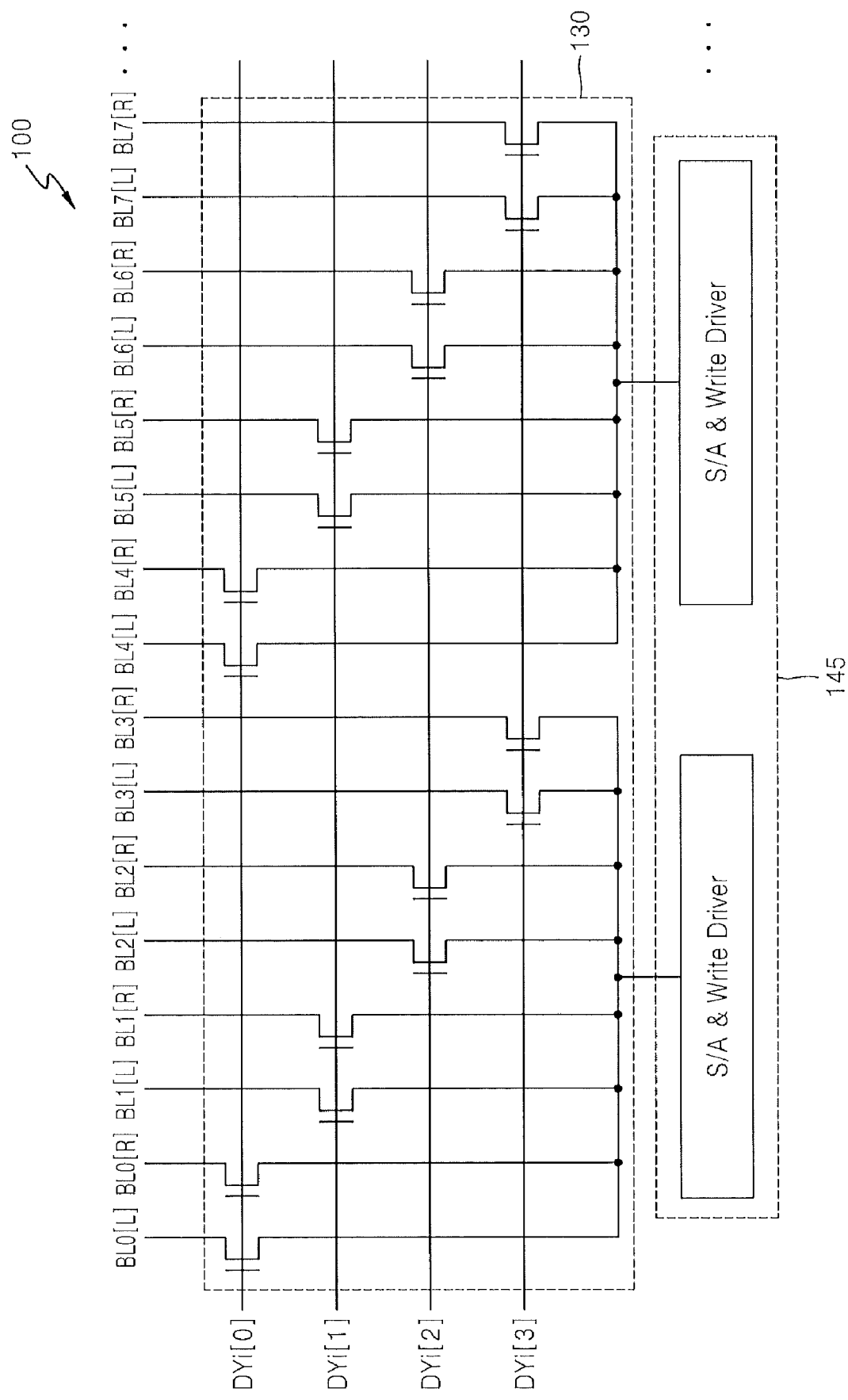
FIG. 9 is a circuit diagram of the sensing line decoder and sense amplifier/write driver of the information storage device of FIG. 6 according to some embodiments of the present inventive subject matter.

FIG. 9 is a circuit diagram of the bit line/sensing line decoder 130 and sense amplifier/write driver 145 of FIG. 6 according to some embodiments of the present invention. Four pairs of bit line signals BLn[L, R] through BLn+4 [L, R] are associated with each sense amplifier/write driver. Four bit line selection signals DYi[0 . . . 3] are used to select one of the bit line pairs associated with each sense amplifier/write driver. The sense amplifier may sense the data on the selected bit line pair to be output from the memory unit or the write driver may write data to the selected bit line pair to be stored in the memory unit.

Figure 10A:
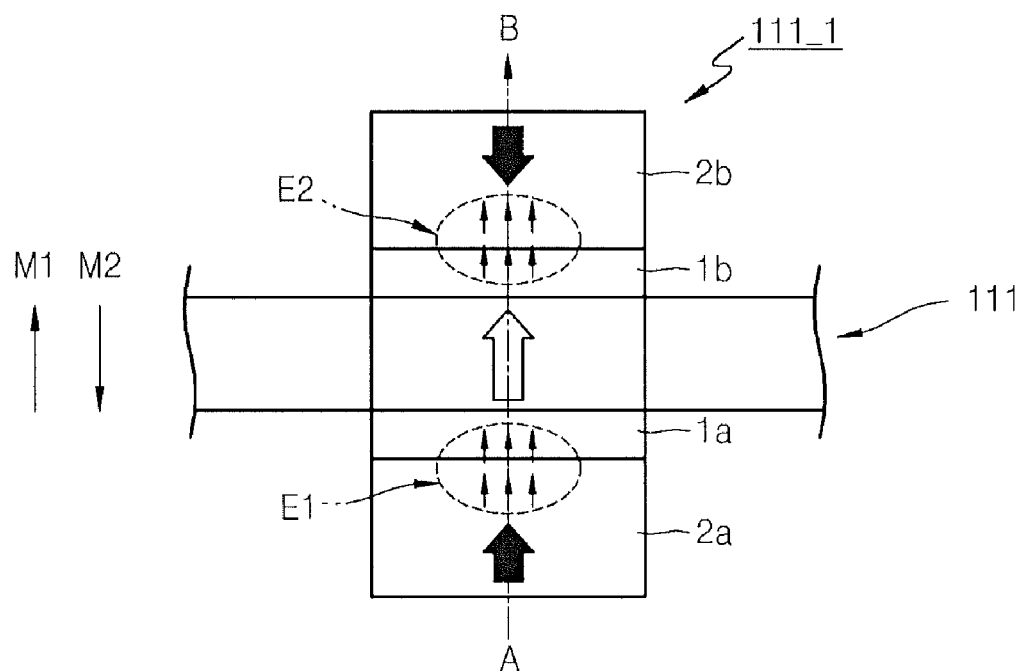
FIGS. 10A and 10B are diagrams illustrating the write/read units of FIGS. 2 and 6 according to some embodiments of the present inventive subject matter.
Figure 10B:
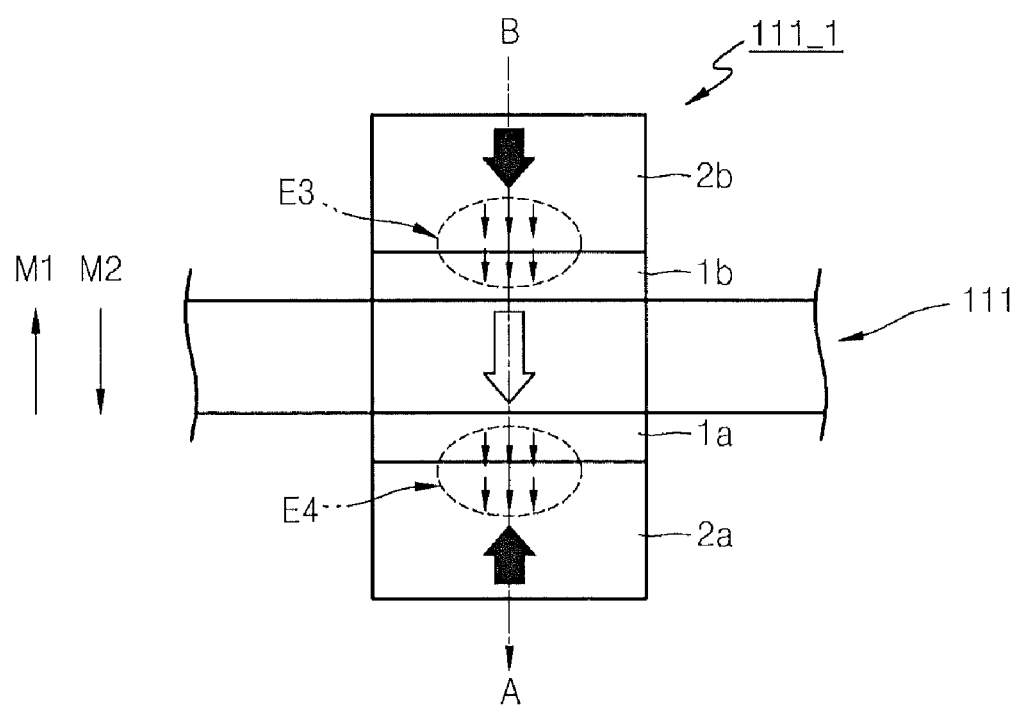

FIGS. 10A and 10B are diagrams illustrating the write/read unit W/R of FIGS. 2 and 6, according to some embodiments of the present inventive subject matter. Referring to FIGS. 10A and 10B, the write/read unit (W/R) 111_1 according to some embodiments may include a first ferromagnetic layer 2a located at a bottom surface of a magnetic track (MT) 111 and a second ferromagnetic layer 2b located at a top surface of the magnetic track MT. The first ferromagnetic layer 2a and the second ferromagnetic layer 2b are pinned layers, the directions of magnetization of which are opposite to each other. Referring to FIGS. 10A and 10B, arrows in the first ferromagnetic layer 2a denote the direction of magnetization of the first ferromagnetic layer 2a, and arrows in the second ferromagnetic layer 2b denote the direction of magnetization of the second ferromagnetic layer 2b. Also, the first ferromagnetic layer 2a and the second ferromagnetic layer 2b may be isolated from a first magnetic track 111 by a first insulating layer 1a and a second insulating layer 1b, respectively.

A write operation using the write/read unit 111_1 will now be described.

FIG. 10A illustrates a case where electrons move from the first ferromagnetic layer 2a to the second ferromagnetic layer 2b (along a direction from A to B). In this case, electrons E1 magnetized along a direction M1 that is the same as the direction of magnetization of the first ferromagnetic layer 2a (hereinafter referred to as a "first direction"), move to the magnetic track MT. The moved electrons E1 magnetize the magnetic track MT along the first direction M1. This phenomenon may be referred to as the spin transfer torque effect.

In the second ferromagnetic layer 2b, electrons magnetized along a direction M2 that is the same as the direction of magnetization of the second ferromagnetic layer 2b (hereinafter referred to as a "second direction"), are discharged from the second ferromagnetic layer 2b but electrons E2 magnetized along a direction opposite to the direction of magnetization of the second ferromagnetic layer 2b are not discharged from the second ferromagnetic layer 2b and return to the magnetic track MT. The electrons E2 magnetize the magnetic track MT along the first direction M1. This phenomenon may be referred to as the spin accumulation effect.

FIG. 10B illustrates a case where electrons move from the second ferromagnetic layer 2b to the first ferromagnetic layer 2a (along a direction from B to A). In this case, electrons E3 magnetized along the second direction M2 move to the magnetic track MT. The electrons E3 magnetize the magnetic track MT along the second direction M2. In the first ferromagnetic layer 2a, electrons magnetized along the first direction M1 are discharged from the first ferromagnetic layer 2a but electrons E4 magnetized along the second direction M2 are not discharged from the first ferromagnetic layer 2a and return to the magnetic track MT. The electrons E4 magnetize the magnetic track MT along the second direction M2.

A read operation using the write/read unit W/R will now be described.

First, an electrical resistance between the first ferromagnetic layer 2a or the second ferromagnetic layer 2b of the write/read unit W/R and the magnetic track MT is measured. The electrical resistance varies according to a direction of magnetization of the write/read unit W/R. Data stored in the magnetic track MT is read by measuring the electrical resistance, and the measurement of the electrical resistance is repeatedly performed while moving magnetic domains and magnetic domain walls in units of bits.

The current supplied to the write/read unit W/R during the reading of the data is less than the current used to perform a write operation. Thus, the data stored in the magnetic track MT may be retained during a read operation.

Figure 11:
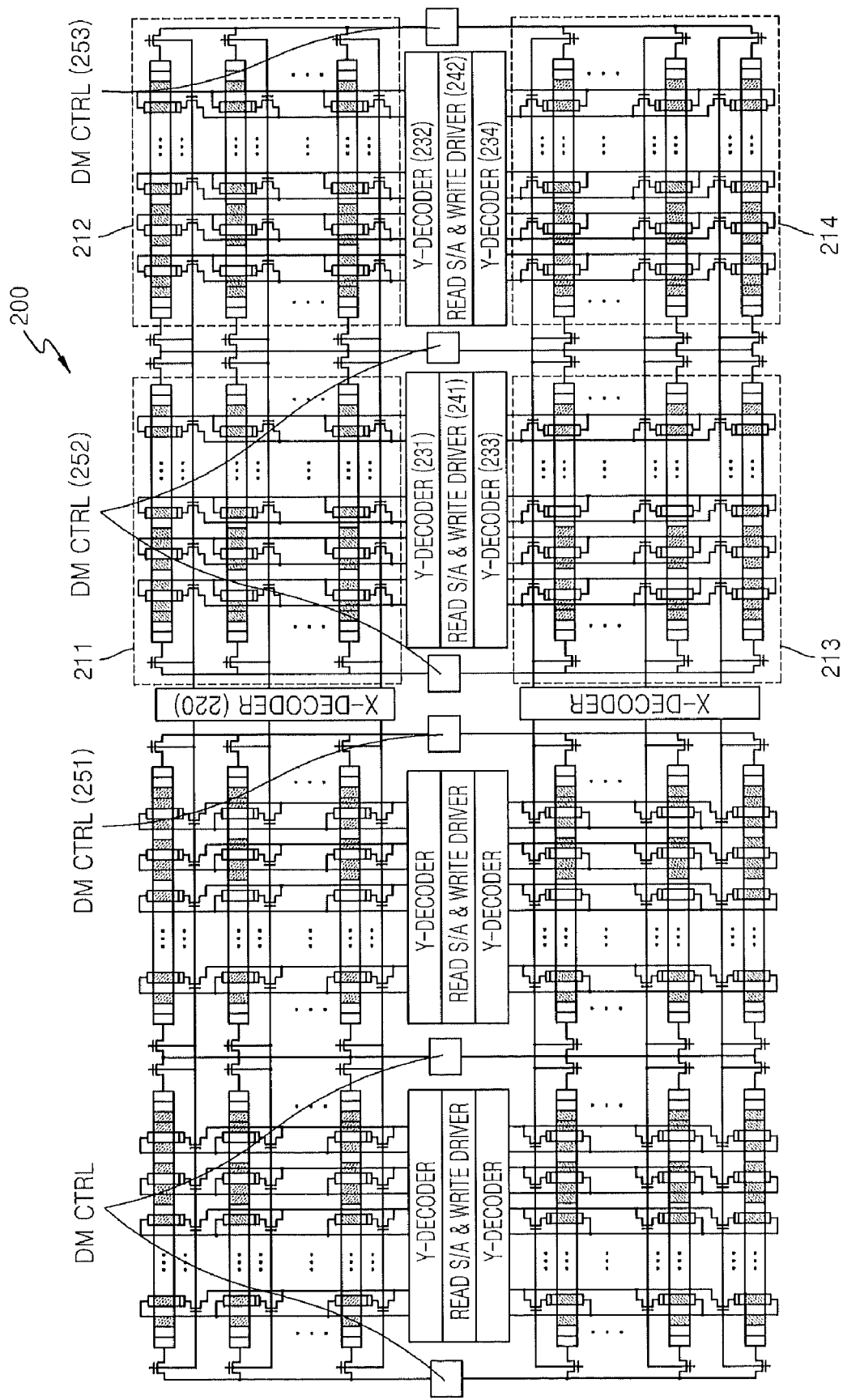
FIGS. 11-13 are schematics of the information storage device of FIG. 6 in which multiple memory units/memory arrays are used according to some embodiments of the present inventive subject matter.

FIG. 11 is a schematic of an information storage device 200 in which multiple memory units/memory arrays of FIG. 6 are used according to some embodiments of the present inventive subject matter. Referring to FIG. 11, the information storage device 200 according to some embodiments of the present inventive subject matter comprises a plurality of memory units 211, 212, 213, and 214 and may comprise a row/bit-line/selection line decoder (X-DECODER) 220, a plurality of bit line/sensing line decoders (Y-DECODER) 231, 232, 233, and 234, a plurality of sense amplifiers/write drivers 241 and 242, and a plurality of domain controllers 251, 252, and 253 that are configured as shown.

As shown in FIG. 11, memory units vertically adjacent to one another may share the same sense amplifier/write driver, e.g., memory units 211 and 213 share sense amplifier/write driver 241. Four memory units may also share three domain controllers, e.g., memory units 211, 212, 213, and 214 share domain controllers 251, 252, and 253. Memory units may also share a row/bit-line/selection line decoder with horizontally adjacent memory units, e.g., memory unit 211 shares row/bit-line/selection line decoder 220 with a horizontally adjacent memory unit.

Figure 12:
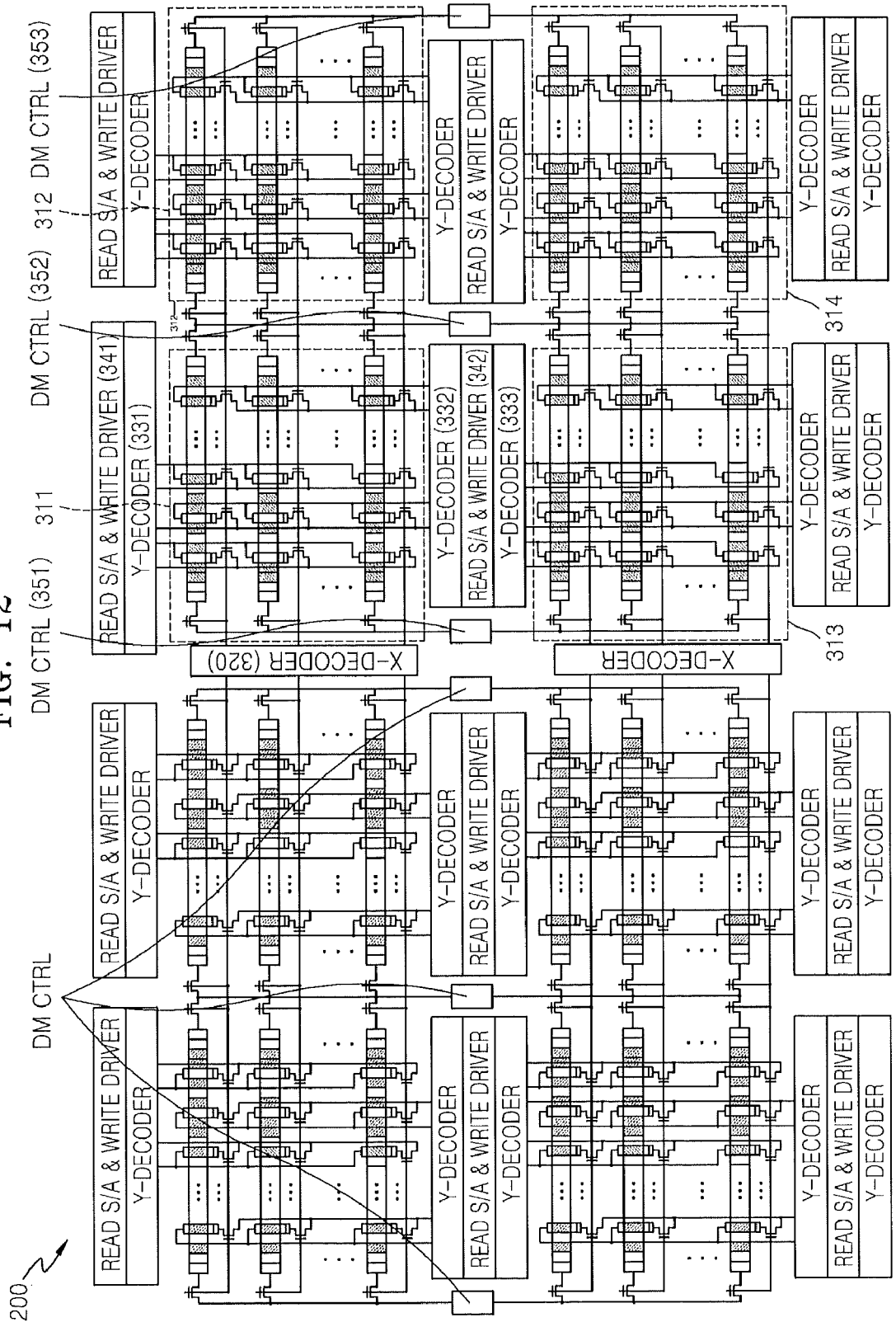

FIG. 12 is a schematic of an information storage device 300 in which multiple memory units/memory arrays of FIG. 6 are used according to some embodiments of the present inventive subject matter. Referring to FIG. 12, the information storage device 300 according to some embodiments of the present inventive subject matter comprises a plurality of memory units 311, 312, 313, and 314 and may comprise a row/bit-line/selection line decoder 320, a plurality of bit line/sensing line decoders 331, 332, and 333, a plurality of sense amplifiers/write drivers 341 and 342, and a plurality of domain controllers 351, 352, and 353 that are configured as shown.

As shown in FIG. 12, memory units vertically adjacent to one another may share the same sense amplifier/write driver, e.g., memory units 311 and 313 share sense amplifier/write driver 342. Four memory units may also share three domain controllers, e.g., memory units 311, 312, 313, and 314 share domain controllers 351, 352, and 353. Memory units may also share a row/bit-line/selection line decoder with horizontally adjacent memory units, e.g., memory unit 311 shares row/bit-line/selection line decoder (X-DECODER) 320 with a horizontally adjacent memory unit. Each memory unit may have a pair of bit line/sensing line decoders associated therewith. For example, memory unit 311 has a first bit line/sensing line decoder (Y-DECODER) 331 associated therewith that is used to decode even bit lines and a second bit line/sensing line decoder 332 associated therewith that is used to decode odd bit lines. Bit line/sensing line decoder 333 may be used to decode odd bit lines in memory unit 313 and sense amplifier/write driver may be used to read and write odd bit lines in both memory units 311 and 313. Thus, decoders 332, 333 along with sense amplifier/write driver 342 may form an odd bit line decoder/read-write unit. These units may be formed between vertically adjacent memory units to decode even bit lines and odd bit lines in alternating fashion.

Figure 13:
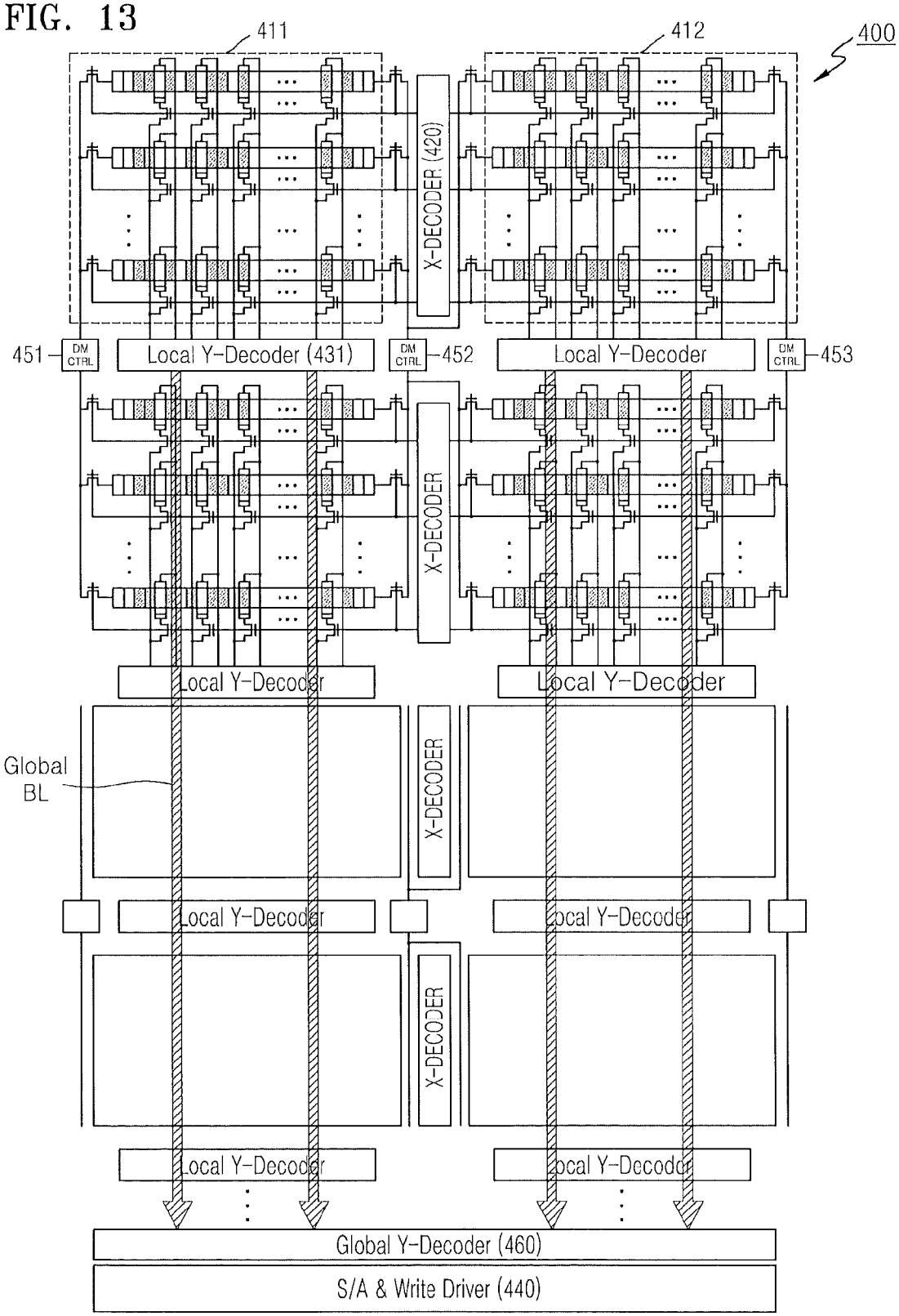

FIG. 13 is a schematic of an information storage device 400 in which multiple memory units/memory arrays of FIG. 6 are used according to some embodiments of the present inventive subject matter. Referring to FIG. 13, the information storage device 400 according to some embodiments of the present inventive subject matter comprises a plurality of memory units 411 and 412 and may comprise a row/bit-line/selection line decoder (X-DECODER) 420, a local bit line/sensing line decoder (Local Y-DECODER) 431, a global bit-line/sensing line decoder (Global Y-DECODER) 460, a sense amplifier/write driver 440, and a plurality of domain controllers 451, 452, and 453 that are configured as shown.

As shown in FIG. 13, each memory unit has a local bit line/sensing line decoder associated therewith, e.g., memory unit 411 has local bit line/sensing line decoder 431 coupled thereto. Four memory units may also share three domain controllers, e.g., four memory units shown in FIG. 13 share domain controllers 451, 452, and 453. Memory units may also share a row/bit-line/selection line decoder with horizontally adjacent memory units, e.g., memory unit 411 shares row/bit-line/selection line decoder 420 with memory unit 412. Vertically adjacent memory units may have common global bit lines associated therewith. All of the memory units shown in FIG. 13 are associated with the global bit-line/sensing line decoder 460 and the global sense amplifier/write driver 440.

Figure 14:
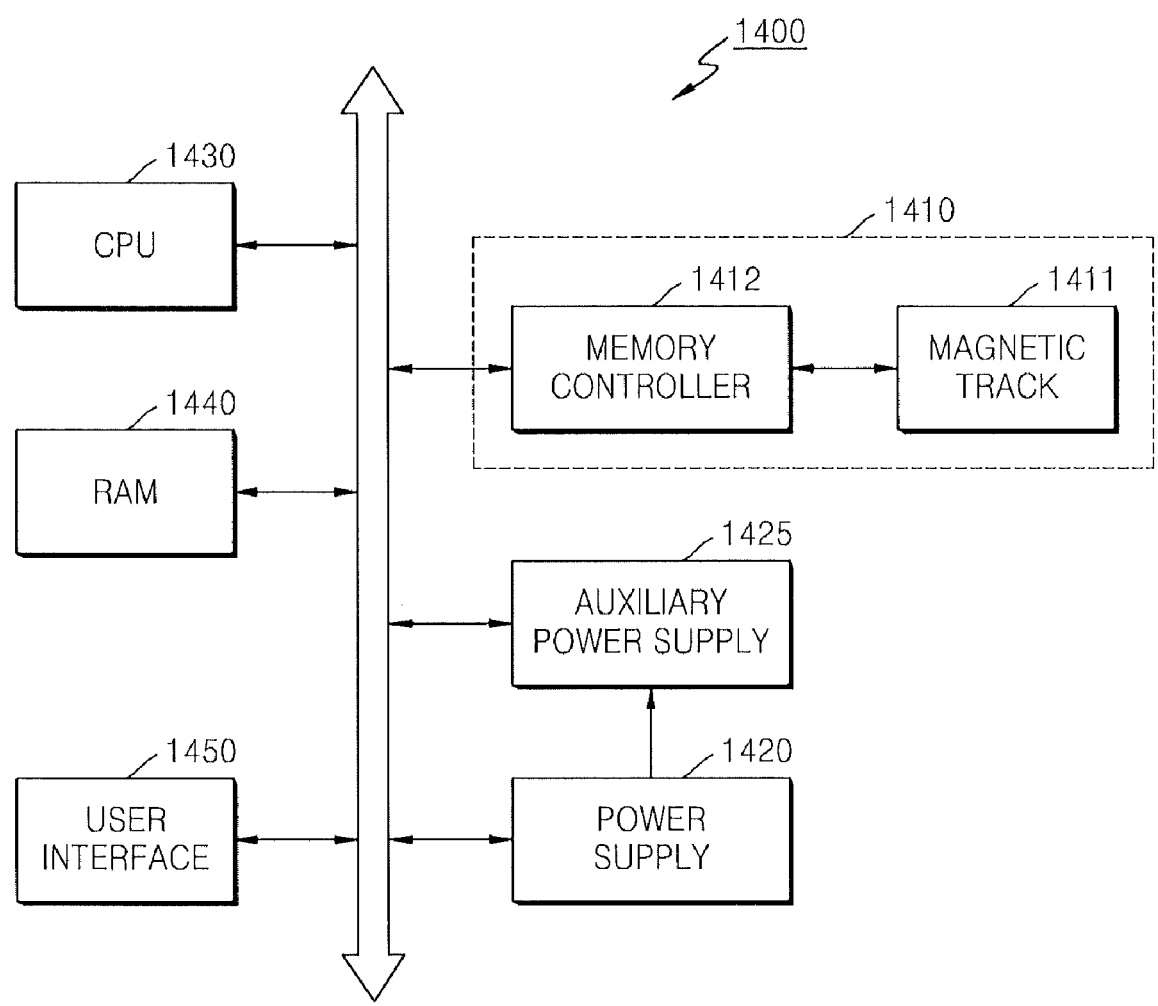
FIG. 14 is a block diagram of an electronic apparatus including a nonvolatile memory device according to some embodiments of the present inventive subject matter.

FIG. 14 is a block diagram of an electronic apparatus 1400 including a nonvolatile memory device according to some embodiments of the present inventive subject matter. The electronic apparatus 1400 may include, but is not limited to, a computer, a mobile terminal, a Personal Digital Assistant (PDA), a camera, a game console, an MP3 player, a television, a DVD player, a router, or a GPS system.

Referring to FIG. 14, the electronic apparatus 1400 includes a semiconductor memory device 1410, a power supply 1420, an auxiliary power supply 1425, a CPU 1430, a RAM 1440, and a user interface 1450. The semiconductor memory device 1410 includes a magnetic track memory 1411 according to the embodiments described above and a memory controller 1412.

In some embodiments of the present inventive subject matter, an information storage device comprising one or more memory units as described above may further comprise a temperature sensor. The read/write current used to read data from and write data to the memory unit(s) and/or the time that the read/write current is applied may be adjusted based on the temperature measured by the sensor.

During a program-verify operation, conventional nonvolatile memory devices may increase the program voltage Vpgm gradually by program loop. This program scheme is called an incremental step pulse program (ISPP) scheme. In other implementations, a nonvolatile memory device may maintain the constant program voltage Vpgm or may gradually reduce the program voltage Vpgm. According to some embodiments of the present inventive subject matter, if the verify operation indicates that a program operation failed in a magnetic track memory unit, then the current may be increased in a subsequent program operation. In some embodiments, the current may be increased by increasing the duration of the programming pulse. In other embodiments, the current may be increased by increasing both the duration and the voltage level of the programming pulse.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. An integrated circuit memory system, comprising:
a memory array comprising at least one magnetic track, each of the at least one magnetic track comprising a plurality of magnetic domains and at least one read/write unit coupled thereto;
decoding circuitry coupled to the memory array that is operable to select at least one of the magnetic domains;
a read/write controller coupled to the memory array that is operable to read data from at least one of the plurality of magnetic domains and to write data to at least one of the plurality of magnetic domains via the at least one read/write unit coupled to each of the at least one magnetic track; and
a domain controller coupled to the memory array that is operable to move data between the magnetic domains on each of the at least one magnetic track.

2. The integrated circuit memory system of claim 1, wherein the memory array comprises a plurality of memory arrays, each of the memory arrays comprising at least one magnetic track, each of the at least one magnetic track comprising a plurality of magnetic domains and at least one read/write unit coupled thereto;
wherein a first one of the plurality of memory arrays shares the read/write controller with a second one of the plurality of memory arrays; and
wherein the first one of the plurality of memory arrays shares the decoding circuitry with a third one of the plurality of memory arrays.

3. The integrated circuit memory system of claim 1, wherein each of the at least one read/write unit is coupled to the decoding circuitry via a single control transistor.

4. The integrated circuit memory system of claim 1, wherein each of the at least one read/write unit is coupled to the decoding circuitry via a pair of control transistors.

5. The integrated circuit memory system of claim 1, wherein each of the at least one magnetic track comprises buffer magnetic domains at opposing ends thereof.

6. The integrated circuit memory system of claim 5, wherein each of the at least one magnetic track further comprises at least one buffer magnetic domain between the first and second buffer magnetic domains.

7. The integrated circuit memory system of claim 1, wherein the memory array comprises a plurality of memory arrays, each of the memory arrays comprising at least one magnetic track, each of the at least one magnetic track comprising a plurality of magnetic domains and at least one read/write unit coupled thereto;
wherein the domain controller comprises a plurality of domain controllers;
wherein a first one of the plurality of memory arrays shares the decoding circuitry with a vertically adjacent second one of the plurality of memory arrays;
wherein the first one of the plurality of memory arrays shares the read/write controller with a horizontally adjacent third one of the plurality of memory arrays; and
wherein the first one of the plurality of memory arrays, the second one of the plurality of memory arrays, a fourth one of the plurality if memory arrays, and a fifth one of the plurality of memory arrays share three of the plurality of domain controllers, which are operable to move data between the magnetic domains on each of the at least one magnetic track on the first, second, fourth, and fifth ones of the plurality of memory arrays.

8. The integrated circuit memory system of claim 1, wherein the memory system is embodied in a memory card device, Solid State Drive (SSD) device, ATA bus device, Serial ATA (SATA) bus device, Small Computer System Interface (SCSI)device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

9. The integrated circuit memory system of claim 1, wherein the memory system is embodied in a graphics card, a computer, a mobile terminal, a Personal Digital Assistant (PDA), a camera, a game console, an MP3 player, a television, a DVD player, a router, or a GPS system.

* * * * *